United States Patent [19]

Baldi

[11] 4,435,481
[45] Mar. 6, 1984

[54] PYROPHORIC FOIL AND ARTICLE, AND PYROPHORIC TECHNIQUE

[75] Inventor: Alfonso L. Baldi, Wynnewood, Pa.

[73] Assignee: Alloy Surfaces Company, Inc., Wilmington, Del.

[21] Appl. No.: 172,671

[22] Filed: Jul. 28, 1980

Related U.S. Application Data

[63] Continuation-in-part of Ser. No. 25,456, Mar. 30, 1979, Pat. No. 4,349,612, which is a continuation-in-part of Ser. No. 963,313, Nov. 24, 1978, abandoned.

[51] Int. Cl.$^3$ .................. B32B 15/02; B32B 15/18
[52] U.S. Cl. ............................. 428/550; 73/23;
102/336; 149/15; 343/18 E; 427/252; 428/457;
428/553; 428/606; 428/607; 428/613; 428/624;
428/649; 428/660; 431/99; 431/268; 502/527;
502/301; 502/338
[58] Field of Search ............... 428/606, 607, 649, 660,
428/457, 550, 553, 613; 149/15; 102/336;
431/99; 252/477 Q; 148/6.14 R

[56] References Cited

U.S. PATENT DOCUMENTS

| | | | |
|---|---|---|---|
| 2,198,254 | 4/1940 | Koehring | 428/553 |
| 3,068,157 | 12/1962 | Vielstich et al. | 204/228 X |
| 3,379,635 | 4/1968 | von Doehren et al. | 252/477 Q X |
| 3,560,404 | 2/1971 | Jung et al. | 252/477 Q X |
| 3,631,835 | 1/1972 | Hamontre et al. | 428/607 X |
| 3,637,437 | 1/1972 | Goldberger | 428/600 X |
| 3,677,721 | 7/1972 | Elbert et al. | 428/550 X |
| 4,154,705 | 5/1979 | Baldi et al. | 252/477 Q X |
| 4,292,208 | 9/1981 | Baldi et al. | 428/613 X |
| 4,349,612 | 9/1982 | Baldi | 428/607 |

OTHER PUBLICATIONS

Chemiker Zeitung, vol. 99, pp. 447–448 (1975).
Mellor: Comprehensive Treatise on Inorganic and Theoretical Chemistry, vol. 7, Longmans, Green & Co., New York, 1927, pp. 390 and 391.

*Primary Examiner*—Richard D. Lovering
*Attorney, Agent, or Firm*—Connolly and Hutz

[57] ABSTRACT

Pyrophorically activated surfaces of metal foil or screen, prepared by diffusing into surface a selectably removable second metal that is then selectively removed as by leaching, can be covered with reactive or inert materials. Reactive materials such as easily ignited metals or carbon or decomposable chemicals increase the heat generated by pyrophoric action. Inert materials slow down or prevent pyrophoric action. Pressure-sensitive adhesive tape in which the adhesive is of the non-transfer or transfer types can be adhered to pyrophorically activated surfaces to slow down action or to adhere material that reduces or increases severity of pyrophoric action. Pyrophoric Ni can be preserved for many months in alkaline solutions such as aqueous KOH, NaOH and triethanolamine. Pyrophoric Fe is prepared and preserved in aqueous alkaline stannite. Even better preservation is obtained for Ni and Fe with glycerine, ethylene glycol, triethanolamine and propylene oxide. Both can also be preserved in inert gases such as argon. Addition of $SnCl_2$ or metallic Sn to caustic solutions used as leachant improves the pyrophoric uniformity of iron and also reduces the curling of thin foils. Foils with adhesively held combustable metal powder provide excellent pyrophoricity with long thermal life. Continuous processes for making the activated metals are illustrated, and the activated metals can be used to test for oxygen.

7 Claims, 3 Drawing Figures

PYROPHORIC FOIL AND ARTICLE, AND PYROPHORIC TECHNIQUE

The present application is in part a continuation of application Ser. No. 25,456 filed Mar. 30, 1979 now U.S. Pat. No. 4,349,612, which in turn is a continuation-in-part of application Ser. No. 963,313 filed Nov. 24, 1978 and subsequently abandoned.

This invention relates to pyrophoric articles and methods for making and using them. It is an improvement on the pyrophoric developments described in U.S. Pat. Nos. 4,154,705, 3,637,437, and 3,560,404, and it embraces the subject matter of the above-identified parent applications the contents of which are incorporated herein as though fully set forth.

Among the objects of the present invention is the provision of novel pyrophoric articles as well as new methods for making pyrophoric materials.

BRIEF DESCRIPTION OF DRAWINGS

These as well as additional objects of the present invention will be more fully understood from the information supplied in the parent applications and from the following description of several of its embodiments, reference being made to the accompanying drawings wherein.

As pointed out in the parent applications, thin foils or screens of nickel or iron, or steel, or alloys of these materials with each other or with other metals, can be made highly pyrophoric. The pyrophoricity can thus be arranged to bring the temperature of the metal to 1800° F. or even higher. To this end the metal should be thin, generally less than ten mils thick, and should not have too much non-pyrophoric content so as not to absorb excessive heat from the pyrophoric reaction.

Pyrophoricity is very effectively provided by a Raney type activation using pack diffusion to form on the surface of the metal an alloy case in which the metal is alloyed with at least about 20% aluminum, zinc, or other selectively removable second metal that forms an intermetallic compound with the first metal.

The subsequent removal of the second metal as by leaching, leaves the first metal in a porous condition with a distorted lattice structure that exhibits a high degree of pyrophoricity when exposed to oxygen. The porosity, which is usually associated with a mud-crack gross appearance, makes the pyrophoric layer relatively fragile and it is important for ruggedness to have the pyrophoric layer integral with a base stratum that is not pyrophorically activated.

By way of example a one mil thick activated nickel or iron foil can have as much as 0.4 mil deep activated faces, so that about 0.2 mil unactivated metal backbone is present to make the foil fairly rugged. A little of the selectively removable metal may remain in the unactivated backbone. Such a product can be made by activating a virgin foil ½ mil thick.

Silver and high-chromium alloys of iron do not become pyrophoric to any significant extent when treated in the above manner, although they do form a mud-cracked highly porous and active surface. Platinum and palladium become pyrophoric, but the palladium pyrophoricity is insignificant unless zinc is used as the selectively removable metal.

A feature of pyrophoric foils is that a mass of them can be used as radar and heat-detector decoys. Their metallic nature makes them good radar targets and heat pyrophorically developed on them attracts heat-seeking missiles. Such missile attraction is greatly improved when the heating effects are prolonged, for example 15 to 30 seconds or more, or when the heating takes the temperature up to a very high level.

Strips of screening are not as desirable as foils for such decoy use inasmuch as they do not pack as much pyrophoricity in a small bulk, and so are more awkward to carry, as for instance in an airplane for ejection to make the decoy. Also even fine mesh screen does not reflect radar or give thermal effects as well as foil.

Increasing the heat dwell can be effected in different ways. As disclosed in the parent applications combustible materials can be affixed to the pyrophoric surface so that they are ignited by the pyrophoric action and generate more heat. One end of a magnesium ribbon rolled under pressure into the pyrophoric surface, can thus be ignited to cause the ribbon to burn over a very long period of time. Magnesium powder can also be adhered to a pyrophoric surface by a very thin layer of resin binder such as the transferred layer of adhesive from a transfer type tape, and will similarly be set afire although such powder burns much more rapidly than a magnesium foil. The following is such an example:

EXAMPLE 1

A one mil thick nickel foil 1 inch long and ½ inch wide was activated by the process described in Example II of U.S. Pat. No. 4,154,705. Before drying the resulting activated foil, it was washed with water, then acetone, and finally rinsed in a 3.5% solution of poly (ethyl acrylate) in methylchloroform. A very thin film of this solution remained on the foil, 0.1 gram of 250 mesh magnesium powder was scattered over the wet film on one face of the foil, and the foil then hung to dry in an argon atmosphere.

The dried coated foil was removed from the argon atmosphere, and contacted with air. After a few seconds delay it began to heat up and shortly thereafter the heat output rose abruptly igniting the magnesium particles which burned over a period of about 20 seconds. The foil temperature rose to over 2000° F.

Carbon, aluminum and titanium particles can also be ignited this way, and these various particles can be used in mixtures. A mixture of 7 parts by weight magnesium powder, 4 parts by weight aluminum powder and 2 parts by weight carbon powder, coated on an activated nickel foil has caused that foil to reach over 2550° F. when exposed to air. Foils of 1010 steel and iron are sufficiently pyrophoric to ignite magnesium, aluminum and titanium powder and thus become heated to over 2200° F. Such an accentuated pyrophoric reaction of iron and steel takes place more rapidly than an unassisted pyrophoric reaction of these metals, so that the duration of the temperature elevation is shorter even though the maximum temperature reached is greater. Typical shortenings of the duration are from about 30 to about 60%.

Applying to an activated foil a more concentrated solution of resin binder, such as one having at least about 7% resin, will upon draining and drying leave a film about 0.3 mil thick that blocks the pyrophoric action so that there is no perceptable warming of the foil. It appears that the solution of the foregoing Example 1 leaves a film sufficiently porous to air, about 0.1 mil thick, to permit very effective pyrophoric action.

Solutions of other resins in the same or other solvent show corresponding effects. Making any such solution sufficiently dilute will permit them to cover a pyrophorically activated surface with a dried film that does not prevent a pyrophoric reaction of that surface when exposed to air. Highly halogenated resins such as chlorinated polyethylene and chlorinated polystyrene have a fire-extinguishing effect that is not desirable where pyrophoricity is not to be completely suppressed. Resins that are combustible enhance pyrophoricity, and the greater the heat of the combustion, the greater the enhancement.

Suitable solvents for the purpose include:
methylene chloride
methyl ethyl ketone
chloroform
isopropanol
n-hexane
carbon disulfide
sulfuryl chloride
diethylamine
diethyl ether
and
nitromethane When applying and drying a coating, it is desirable to do so in an oxygen-free inert atmosphere to assure that a pyrophoric reaction does not inadvertently take place. Generally any covering film of liquid such as water, on the pyrophorically activated surface will prevent a pyrophoric reaction. Such prevention may have been one reason why pyrophoric activity is not mentioned in U.S. Pat. Nos. 3,408,230 and 3,408,231. However, very thin films of liquid such as triethanolamine will not prevent such a reaction and will actually increase the amount of heat generated by such a reaction. About one milligram of triethanolamine per square centimeter of gross surface (as measured with a ruler) is the maximum that can be applied as a coating without preventing a pyrophoric reaction. Most of this coating is absorbed into the pores of the activated surface and indeed it is difficult to visually detect the presence of the one milligram per square centimeter coating.

Coatings of materials that do not form films cannot be relied on for preventing a pyrophoric reaction. Aqueous sodium silicate and sodium hydroxide, will upon drying to a solid, form films that when thick enough will block pyrophoric action.

A pyrophorically activated surface can also have pressure-sensitive adhesive tape adhered to it to block the pyrophoric reaction when the surface so coated is exposed to oxygen. On the other hand, pressure-sensitive adhesive tape can be applied to a pyrophoric member without covering its pyrophoric surface, or without covering all of its pyrophoric surface, and thus contribute material that increases or decreases the pyrophoric effects.

Different makes of pressure-sensitive adhesive tapes have proven useful in the foregoing manner, and range from regenerated cellulose tape to paper tape (masking tape), to Mylar tape and even to metal tape.

Where the tape is combustible, it will generally be oxidized by the pyrophoric reaction. Aluminum tape having a pressure-sensitive adhesive coating will generally not ignite, even if the aluminum is only ½ mil thick, but magnesium tape is ignited when in thicknesses up to about 5 mils. The pressure-sensitive adhesive is generally an organic polymer that is readily oxidized.

Pressure-sensitive tape is best applied to a pyrophorically activated surface in an inert atmosphere, and the activated surface need not be dry, but can be wet with liquids that do not intefere with the tape application.

The pressure-sensitive tapes can also be used to secure combustible material such as magnesium, titanium, aluminum or carbon powder to the activated surface. The powder should not cover all of the surface, but should leave some uncovered preferably around the margin of the tape, so as to provide sites for the tape to adhere to. Also if the tape is relied on to anchor the particles in place during the pyrophoric action, there should be some activated metal surface not covered by the tape.

Two-sided pressure-sensitive tape, that is tape having each face coated with a layer of pressure-sensitive adhesive as described in U.S. Pat. No. 3,896,215, can be used to adhere two pyrophoric foils back-to-back. A similarly laminated combination can be made of transfer-type pressure-sensitive tape such as that described in U.S. Pat. No. 3,509,991, having a layer of pressure-sensitive adhesive held on a backing strip to which it does not securely adhere. The adhesive-carrying strip is pressed onto a surface of pyrophoric tape and the backing strip then pulled off leaving its pressure-sensitive layer on the tape. Another pyrophoric tape is then pressed against the resulting exposed pressure-sensitive layer and is thus adhered to the first tape. Instead of laminating a second pyrophoric tape to the first pyrophoric tape, a non-pyrophoric tape of combustible material for example can be adhered to the pyrophoric tape, or a layer of finely-divided material can be so adhered.

Where the adhesive is applied to a non-pyrophoric surface of the first tape, the adhesive and any material secured to it can be used to increase the pyrophoric effects by contributing combustible material such as magnesium powder or foil that is ignited by the pyrophoric action and then burns with considerable evolution of heat.

A non-porous layer of pressure-sensitive adhesive applied to a pyrophoric surface will block its pyrophoric action by keeping it from contact with oxygen. This blocking action is improved by a non-porous backing such as polyethylene terephthalate film adhered over the adhesive. A nickel foil having one pyrophorically activated face can thus be preserved by a pressure-sensitive tape for extended periods of time and the tape then pulled off to trigger the pyrophoric action. A similarly treated iron foil has its pyrophoric skin so weakly held to the iron base that the skin is generally pulled off by the removal of the pressure-sensitive tape. The pulled-off skin is thus exposed to the air and undergoes its pyrophoric action even though removed from the iron base.

By incompletely covering a pyrophorically activated surface with a coating such as an adherent blocking layer, or by only loosely applying a blocking layer such as a pressure-sensitive tape, the pyrophoric action is not completely blocked and will take place, sometimes very gradually until the generated heat melts or burns away the covering.

Where the coated pyrophoric assembly is to be made very compact, the pyrophoric foil can be about 1 mil thick before treatment each face activated about 0.45 mil deep (expands to 1.5 mil), and can have only one side covered with a ¾ mil thick pressure-sensitive adhesive tape, a layer of flaked or unflaked magnesium particles about 0.1 mil thick being sandwiched between the foil and the tape. The particles can also be incorporated in the tape, along the line suggested in U.S. Pat. No. 4,004,047.

Alternately the pores of the pyrophoric surface of a foil can be partly or completely filled with very finely divided particles that are caused to oxidize by the pyrophoric action of the surface. For such use the particles should be no larger than about 1 micron in size and can be of such materials as carbon, titanium, aluminum, molybdenum, magnesium or other metal. An unstable suspension of such particles can be made in a readily volatile liquid such as water, with or without the help of a suspending agent, and a little of the suspension poured onto a pyrophorically activated surface. After a minute or so of standing the suspended particles settle out and the volatile liquid permitted to evaporate into an inert atmosphere. A foil so treated will show no significant increase in thickness, yet will generate substantially more heat when exposed to air to start the pyrophoric reaction.

Stable suspensions deposit fewer particles and are not as desirable when maximum effects are desired.

Particles that are essentially inert to the pyrophoric action can be used in place of or in addition to the oxidizable particles. Thus colloidal silica or alumina particles or particles of alumina-silica compounds can be similarly deposited in the pores of a pyrophoric surface, and this will partially block the access of oxygen to that surface so that it is slower in starting its pyrophoric action and the heat generation is spread over a longer time. Very effective colloidal solutions of silica or alumina-silica are sold by DuPont under the name of Ludox.

Pyrophorically activating a nickel or iron foil initially not over 3 mils thick to a depth of about 90% or more of its thickness, leaves a product that is fragile and will not withstand normal handling. Activation to only 80% or less of its thickness leaves a sturdy product. Of course the deeper the activation the greater the pyrophoric reaction it produces.

Pyrophorically activated iron seems to go through two reaction stages when exposed to oxygen or air. The temperature-time profile of a pyrophoric reaction of such iron shows a markedly longer duration of temperature elevation, apparently because the reaction goes through two stages in succession and thus persists longer but with less temperature rise than a one-stage reaction.

Also a pyrophorically activated iron surface can be exposed to a very low partial pressure of oxygen and thus caused to undergo a color change corresponding to the first stage of the pyrophoric reaction. The surface can then be protected and later exposed to air to produce a pyrophoric reaction that again changes its color and persists longer than the corresponding reaction of a freshly prepared pyrophoric surface. A partial oxygen pressure of about 1/10 pound or less per square inch will enable this two-stage separation. This small oxygen pressure can be provided as pure oxygen or as oxygen diluted with argon, helium, nitrogen or the like.

Pyrophorically activated nickel can also be subjected to such low oxygen pressures to undergo a minor pyrophoric change that exhausts some of its pyrophoricity. Subsequent exposure to air will then cause the generation of a little less heat than that generated by an activated foil that has been kept out of all prior contact with oxygen. Excessive exposure, as in U.S. Pat. No. 4,043,045, (bottom of column 7) will completely drive off all pyrophoric tendency.

The word "pyrophoric" is used herein in the sense of spontaneously generating heat by chemically reacting with air. It does not refer to the spark-generating character of certain alloys when they are struck or filed.

Preferred pyrophoric members are activated foils of 1010 steel that are about 1 to about 1½ mils thick before activation, and have one face activated to leave about 0.3 mil thick unactivated stratum at the other face. Because of the expanding effects of the activation, the activated foil is about 2.5 to about 5 mils in total thickness. High carbon steels, other low carbon steel, or Armco iron, can be used in place of the 1010 steel, but are more expensive.

Because of its low cost ordinary 1010 steel, which contains about 0.1% carbon, is a particularly desirable material for activation. Although when activated its pyrophoric action is not materially improved by a coating of picric acid or ammonium nitrate or the like, such improvement can be obtained with powdered readily-ignited metals and carbon. Low alloy steels containing 0.9% carbon are accordingly very effective.

Both the pyrophoric peak temperature and thermal life of an activated foil are greater when one face has been activated to a depth twice as much as a corresponding two-faced activation. This may be due at least in part to the greater loss of heat by radiation when the pyrophoric action is taking place at both faces. A similar increase in peak temperature and thermal life takes place when a pyrophorically reacting foil curls upon itself to partially shield some of its surface against radiation losses. However a more deeply activated surface shows a finer and denser structure at its deepest portion, and such structure can generate more heat than the coarser surface portion.

Activation of one face is readily effected by plating the surface of an aluminum sheet with the metal of which the foil is to be made, then heating the plated aluminum to diffusion coating temperature with or without a diffusion coating atmosphere, and finally dissolving away the aluminum to leave the activated plating. Alternatively two preformed foils can be temporarily laminated together as by cementing or rolling them together under pressure or by crimping them together at their edges, and the laminated foils aluminized or zinc-diffused in a diffusion coating pack, after which the foils are peeled apart and subjected to the selective leaching out of the aluminum or zinc.

Laminating together two foils each of which has been activated on both of its surfaces, and then exposure of the laminated assembly to air also increases the peak temperature and duration of the resulting pyrophoric reaction. Such lamination can be effected by cementing, crimping or rolling, as noted above, or by merely placing the foils face-to-face without adhering them to each other. Also a wide activated foil can simply be folded along its center-line to superpose the folded halves. A preferred cementing uses the aforementioned transfer tape.

The rolling of an activated iron or steel surface, as for example between hand rollers that develop pressures of about 160,000 pounds per square inch, whether of a single foil or of a superposed pair of foils, causes the peak pyrophoric temperature to be reduced and the pyrophoric dwell time to be increased. Rolling pressures of from about 32,000 to about 56,000 pounds per square inch give even greater increases in the pyrophoric dwell time, and pressures as low as 16,000 pounds per square inch cause significant reductions in peak temperature with very little increase in pyrophoric dwell time. At about 10,000 pounds per square inch pressure rolling appears to cause no significant change in dwell time but still reduces peak temperatures measurably.

Similar rollings of activated nickel surfaces showed slight lowering in both thermal life and in peak temperature, at all pressures. Preferred activated 1010 steel foils are best rolled at pressures of from about 20,000 to about 200,000 pounds per square inch.

Peening of activated surfaces, as by blows from a ball peen hammer, has less effect than rolling, on activated nickel foil. The activated portion of activated iron foil is apt to be damaged by such peening.

The activated surfaces to be subjected to mechanical treatment such as cold rolling or peening, should be protected against exposure to oxygen, as by a substantial coating of triethanolamine or by an argon atmosphere, or the like. Triethanolamine not only preserves the activated surface, but it reduces the effect of moisture and the like to which such an activated surface may be exposed. In a moist inert atmosphere the unprotected activated surfaces, particularly of iron, tend to gradually deteriorate, and such deterioration is effectively prevented by even a very thin triethanolamine coating, e.g. about 0.3 to 0.7 milligram per square centimeter of gross surface as deposited from dilute solutions of triethanolamine in water or ethanol or the like, or by a spray of diluted or undiluted triethanolamine.

A pyrophorically activated nickel surface can be preserved indefinitely against pyrophoric action by covering with aqueous solutions of sodium or potassium hydroxide, triethanolamine, glycerine, ethylene glycol or propylene oxide. Once such nonvolatile blocking layers are rinsed off or volatile blocking layers evaporated off, and the active surface exposed to air, it undergoes pyrophoric action.

A pyrophorically activated iron or steel surface is more difficult than a nickel surface to block with aqueous solutions of caustic, and its activity falls off relatively rapidly when so blocked. A much better preservative for pyrophorically active iron or steel is the stannite ion as in $Na_2SnO_2$ or $(NH_4)_2SnO_2$. Thus the aluminized steel precursor can be leached in caustic to which metallic tin or stannous chloride is added and the resulting activated iron keeps very well in the used leaching solution. For example 8 grams $SnCl_2.2H_2O$ is added to a solution of 50 grams NaOH in 500 cc water to make a leaching bath which in 30 minutes at about 170° F. or about 2 hours of 100° F. does a very effective job of pyrophorically activating an iron foil 2 mils thick that had been diffusion coated with 25 milligrams of aluminum per square centimeter of its surface. Moreover, the thus activated foil will be protected from pyrophoric action for at least a week as long as it remains covered by the used leaching bath.

The fresh leaching solution containing the tin salt will also do a very good job of preserving activated iron that is leached in tin-free caustic. At least about 5 grams of tin, as stannite ion, per liter of caustic should be used to obtain or maintain good preservation. Even better preservation of activated iron or steel is obtained with triethanolamine ethylene glycol, glycerine and propylene oxide.

Parent application Ser. No. 963,313, now abandoned states that pyrophorically activated nickel loses its pyrophoricity when subject to evacuation at an absolute pressure of about 10 millimeters of mercury, but applicant has found that on several occasions such evacuation leaves such nickel still pyrophoric although less violently so. A similar effect is also produced on pyrophorically activated iron.

The pyrophoric articles of the present invention are particularly useful for indicating the presence of oxygen in an atmosphere. Thus in FIG. 1, an argon box is shown at 10 as having a gas-tight construction with a cover 12, generally a transparent panel, clamped over the top of the box to seal it. An inlet connector 14 is fed from a source of argon such as a pressurized tank fitted with a pressure reducer that supplies the argon at a pressure of about a few inches of water column.

Figures 1, 2:
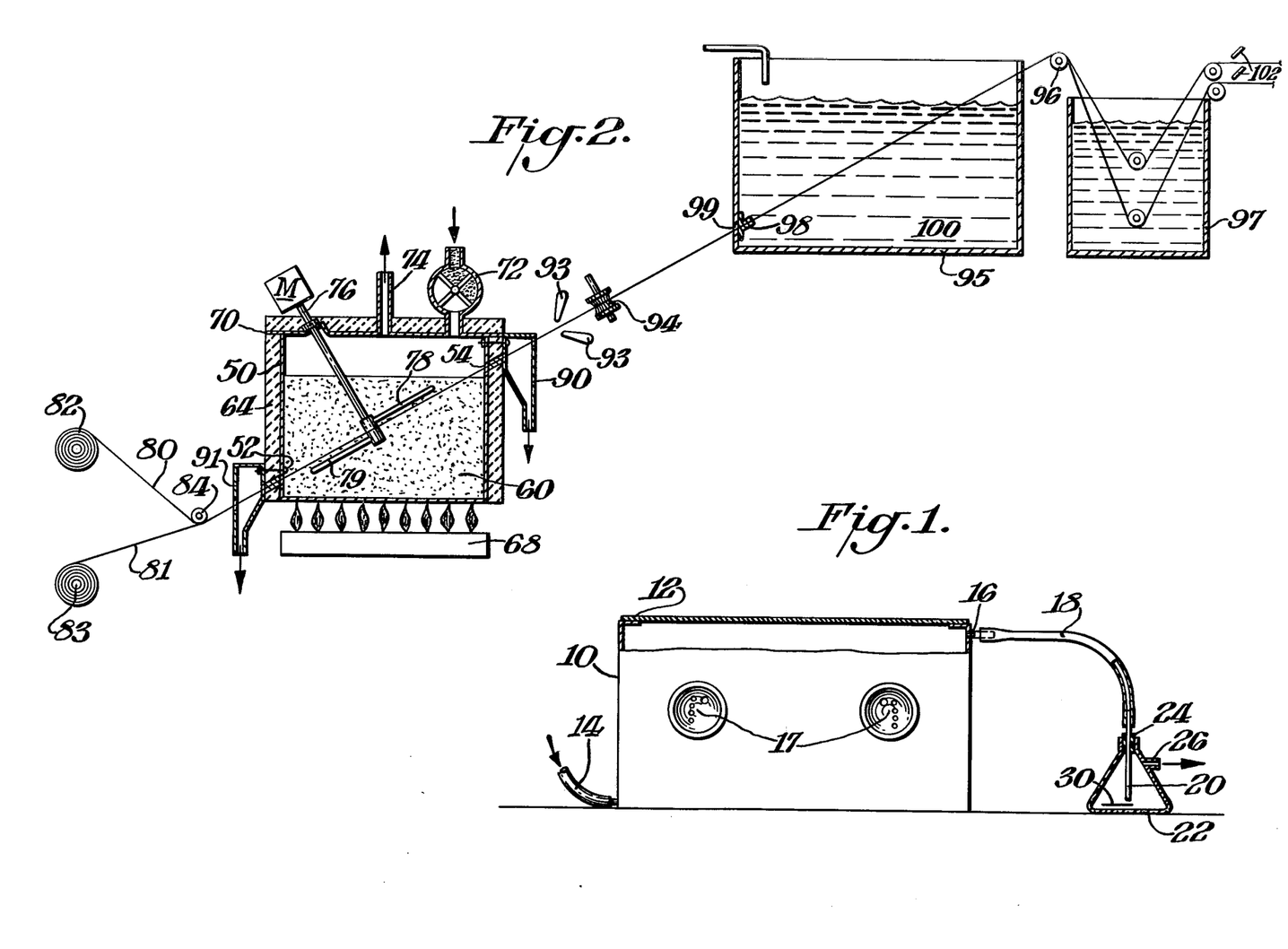
FIG. 1 is a side view, with portions broken away, of an apparatus utilizing a pyrophoric foil of the present invention.
FIGS. 2 and 3 are vertical sectional views of two different apparatuses for manufacturing pyrophoric webs pursuant to the present invention.

Box 10 also has an outlet connector 16 connected to a heavy-walled glass filter flask 22 through a slip-on tube 18 fitted to the upper end of a delivery tube 20 held in a rubber stopper 24 received in the mouth of flask 22. The flask also has a side-arm 26 that opens to the ambient atmosphere to discharge the gases contained in it. The box is also provided with means by which objects in its interior can be manipulated from its exterior. A pair of rubber gloves 17 with their open ends fitted into holes in a wall of the box make a suitable arrangement of this type.

According to the present invention there is introduced into the flask 22 a strip 30 of pyrophorically activated nickel. This can be done by withdrawing stopper 24 along with delivery tube 20, and dropping into the flask a wet pyrophorically activated nickel foil 1.5 mil thick and 1 inch by 1 inch square. Such foil can be freshly removed from a storage solution such as 3 N aqueous NaOH, and rinsed with tap water to leave essentially only a tap water film on the activated foil.

The stopper 24 and delivery tube 20 are then reinserted in the mouth of the flask and the argon stream thus directed to flush out the air that entered the flask while its mouth was open. It may take about 20 second or more for this flushing action to be completed, and it takes at least about that time for the film of water on the nickel tape 30 to evaporate. So long as the activated surface of the nickel is entirely covered with a film of water, even an exceedingly thin film, the nickel will not undergo any significant pyrophoric reaction with air or oxygen in the flask. However, as soon as any portion of the activated surface is exposed by evaporation of the water, it immediately reacts if any oxygen is still present in the flask.

The continued sweeping of argon through the box 10 and the flask will carry into the flask any oxygen that may leak into the interior of the box, or that may enter the box when its lid 12 is opened. Thus when such lid-opening takes place as for example for the purpose of placing something in the box or removing something from its interior, the sweeping will cause any oxygen moving out of the box through outlet 16 to contact the nickel foil 30. To the extent such contacting takes place with a dry activated surface of the foil, that surface will react with the contacting oxygen.

After the first few seconds of argon sweeping that follows the box opening and closing, any oxygen content of the swept argon is relatively low so that the resulting pyrophoric action on the foil 30 is relatively mild and almost unnoticeable. However, that action diminishes the amount of further pyrophoric action the foil can undergo.

According to the present invention such sweeping is continued for at least about half a minute after the foil dries, to determine whether oxygen has been fully swept out of the box interior. Because the time required to place the foil in the flask and reseal the flask could also total about a quarter of a minute, and at least another quarter minute may be needed for the foil to dry, the sweeping argon will have done a pretty good job of sweeping out all oxygen by the time the pyrophoric action can begin.

At the expiration of the ½ minute flow over the dry foil, the flask mouth can be opened to permit air to enter. If there has been little or no oxygen in that half minute of flow, the foil will immediately react when the flask is opened, and become red hot. The more oxygen swept over during the half-minute test, the less vigorous the pyrophoric action when the flask is opened. The degree of vigor is thus a very good indication of the amount of oxygen swept over during the test period.

The maximum pyrophoric reaction of the foil having the above-cited dimensions lasts but a few seconds, after which the foil rapidly cools down. Not enough heat is generated this way to damage the flask, even if the flask is made of high-melting plastic instead of glass.

Prolonging the test sweeping over the dried foil from ½ minute to 1 or 2 minutes or even longer, makes the test more sensitive. In general, however, unless the foil becomes red hot upon opening the flask, the argon flow has not adequately flushed out box 10.

The foregoing test conditions give very dependable results when the argon box has a volume of about one cubic foot and the argon is introduced into it at the rate of about two cubic feet per minute. Larger boxes and/or smaller flow rates call for slowing down the test sequence and extending the test flow over the dried foil. Also the size of the foil can be increased so that it contains a larger activated surface, and a reduction in pyrophoric action becomes more apparent and requires more oxygen.

The degree of pyrophoric activity increases with increases in the fraction of the metal thickness activated. An 80 to 90% activation depth is about the highest practically attainable with nickel that is not over 10 mils thick after activation and as pointed out a greater activity is obtained by activating one face, compared to activating both faces to depths totalling the depth of the one-face activation.

The test foils can be as thick as 10 mils or as thin as ½ mil before activation, and activated to provide an activated layer at least ⅔ the total thickness of the activated foil. Activation generally increases the thickness of the foils by an amount up to four times that penetrated by the activation. Activation of stainless steel to a depth of 0.1 mil or less yields a surface in which pyrophoricity does not make itself evident. A porous activated layer thicker than about 10 mils on any metal, tends to be too friable for normal handling.

Where an activated nickel layer is more than about 1 mil thick and it is held on a very thin substrate, it frequently pyrophorically reacts with explosive violence and a distinct explosion is then heard. Activated nickel layers more than 1.5 mils thick explode when on a metal foil whose unactivated thickness is about 0.2 mil, as will a 2 mil thick activated depth on a 0.3 mil support, and a 3 mil thick activated depth on a 0.5 mil support. Activated iron requires about 50% more activated thickness than nickel to undergo such an explosion when exposed to air.

Thick objects such as the stainless steel jet engine compressor blades aluminized pursuant to U.S. Pat. No. 3,764,371 and then treated with dilute caustic soda as described in column 7 of that patent, do not become pyrophoric and indeed the leaching action of the caustic on these materials does not penetrate to any material depth and does not leave the penetrated surface fissured or porous.

The testing of FIG. 1 can be modified as by providing flask 22 with an additional delivery tube connected through a valved conduit to a source of air or oxygen. In such a modification the test is completed by opening the valve in the valved conduit at the proper time. The use of oxygen instead of air when testing this way further heightens the pyrophoric reaction and sharpens the test.

An alternative testing technique maintains a strip of activated iron, protected by a pressure-sensitive adhesively held covering, in the argon box, and peeling the tape away from the covering when the oxygen content of the box is to be tested. In the presence of oxygen the activated iron which is transferred to the covering by the peeling, generates heat that visibly melts the adhesive. The activated iron strip can have a single activated face thus adhered directly to the inner surface of a wall of the box, and peeled away from the wall in order to test for the presence of oxygen. Such a test can be sharpened by adhering such a strip of the activated metal to the bulb of a very small thermometer. When the strip is pulled off, the activated metal remaining on the thermometer bulb will cause the thermometer to show a rise in temperature if oxygen is present in any significant amount.

The activated metal with its one activated face carrying a very thin layer of pressure-sensitive adhesive, can also be pressed around the tip of a cigarette or cigar to hold the activated metal in place there. Then when the metal is peeled off it leaves the activated layer behind on the cigarette or cigar end, and also exposes that layer to air, so that it pyrophorically reacts and generates sufficient heat to ignite the cigarette or cigar end. Using an adhesive that contains no significant amount of sulfur or phosphorus or the like, provides such ignition without the annoying fumes generated by a conventional match. The adhesive need not be a pressure-sensitive one, and a long length of cigarette paper can for example be manufactured with spaced strips of activated iron foil, or a single long strip, adhered to it in such locations that at least some activated foil ends up on the end of each cigarette made from that length of paper.

Activated nickel strips can be used as igniters in place of activated iron strips, but in that event the nickel strips can be permanently fixed in place on the cigarette or cigar end, and with their activated surface facing outwardly and protected as by a tape secured to it with pressure-sensitive adhesive. The peeling off of that protective tape then exposes the activated surface on the nickel and causes the nickel to be heated by pyrophoric action, thus igniting the cigarette paper or the cigar tobacco. For this construction it is better to have the nickel as thin as practical, not over about 1 mil thick before activation and with the maximum activation depth, so that very little surplus metal is required to be heated.

Other inert gases such as nitrogen, helium and neon can also be used to fill boxes similar to that of FIG. 1. Nitrogen and helium are lighter than air and are preferably introduced into the upper portion of a box that has its venting in its lower portion, so that a better flushing action is obtained. Also with such light gases the flask 22 can be held upside-down, for the same reason.

It is desirable to do the metal activation by a continuous process, and one such arrangement is illustrated in FIG. 2. Here an iron diffusion coating retort 50 is provided with an entrance slot 52 near the bottom of a side wall to admit the foil to be treated. A similar exit slot 54 is provided near the top of an opposing wall to allow the treated foil to leave the retort. The slots are dimensioned to allow minimum clearance, not over about 5 to 10 mils more than the foil thickness so as to not permit excessive leakage from the retort of the powder diffusion-coating pack 60 that is poured into it, or of the vapors present in it.

Retort 50 has its sides enveloped by a thickness of thermal insulation 64, its bottom is positioned over a set of gas or electric burners 68, and its top is covered by an insulated and closely fitted lid 70. The lid carries a gas-lock feeder 72, a vent 74, and a tilted stirrer rod 76 provided with two arms 78,79. Each arm is perpendicular to the rod, and the arms are spaced from each other about ½ inch along the length of the rod.

In FIG. 2 there is also shown a pair of suction draw-offs 91, 90 fitted around the respective slots 52, 54 and connected to a suction source to draw off vapors emerging from the retort.

Through the suction draw-offs and through the slots 52, 54 are threaded a pair of foils 80, 81 unspooled from supply rolls 82, 83 respectively, and guided into back-to-back contact by a guide roll 84 for passage through the retort and then through a leaching bath 100 and around guide roll 96. In the retort the back-to-back foils pass in an inclined direction alongside stirrer arms.

After emerging from the retort the foils pass between jets 93 that blow compressed air against the outer faces of the foils to help clean them, and they then are engaged by opposing stationary or movable brushes 94 to help remove any residual solid particles carried on their faces. Following the mechanical cleaning they pass through leaching tank 95, over guide roller 96 and then the separate foils are threaded through a rinse tank 97.

After the foils are threaded in the foregoing manner, a powder diffusion aluminizing pack 60 is poured into retort 50 and the retort is covered and heated to bring its contents to 1000° to 1050° F., while a slow flow of inert gas such as argon is passed into the mouth of feed trap 72. The mixer 76 is rotated at a relatively low speed, so as to gradually redistribute the pack particles engaging the outer faces of the foils and the foils then pulled slowly through the retort.

Using a pack having a relatively large amount of activator, about 1% $AlCl_3$, 1010 steel foils will become heated to pack temperature and sufficiently aluminized to form cases about 1.3 mil thick, after about 50 minutes dwell in contact with the pack. Thus a two-foot travel through the pack can be accomplished at a speed of 2 2/5 feet per hour, and longer travels at correspondingly greater speeds. Longer dwells at 1050° F., or higher temperatures, or both, can be used to provide cases 2 mils thick or thicker.

The pack need not have much inert material, and can be essentially aluminum powder in which the particle size is preferably at least about five mils. Particles this large have more difficulty escaping through slots 52,54. Up to about 20 to 40% of the pack can be alumina powder of about the same particle size, if desired. The alumina is helpful in keeping aluminum particles from sintering to the tapes or to each other, and can be particularly helpful if the pack has a tendency to local overheating.

Aluminum chloride or other activators such as aluminum bromide can be added to the original pack, and more can be added through lock 72 to replenish losses. More aluminum powder can also be added this way.

Leach tank 95 is filled with 10% aqueous NaOH to leach out aluminum from the faces of the aluminized foils. The leaching action generates heat and the tank contents are preferably kept at about 160° F., external heat being applied if needed. The leach time at that temperature is generally not as long as the aluminizing time so that the travel path through tank 95 can be no longer than the path through retort 50. After about 15 minutes of leaching with caustic of at least 10% strength, the foils lose most of the brittleness they acquire in the aluminizing retort, and can be flexed without damage. As an added precaution the guide roller 96 around which the tape is flexed, is placed above the level of the leaching solution where it can be mounted with its supports out of contact with that solution.

A set of rubber lips 98 can be fitted around the slot 99 through which the tapes enter the leaching bath, to reduce or prevent leakage of bath. Some leakage can be tolerated inasmuch as it fairly readily loses most of its water by evaporation and does not flow down the tapes more than a few inches. Excessive leakage can be rinsed off, if desired, to keep from fouling the brushes 94.

Substantial quantities of hydrogen are liberated in the leaching action and the leach tank 95 can be completely enclosed so that the hydrogen can be confined, led away and collected. Otherwise a hood or suction arrangement can be used to draw off the hydrogen and vent it or burn it safely.

The continual drag-out of leach bath with the emerging foil may not, even with added leakage, be rapid enough to keep the bath from accumulating excessive amounts of aluminum compounds. In that event additional quantities of bath can be continually or intermittently drawn off and discarded, while fresh bath solution is added.

The bath film that adheres to the emerging foil protects the foil against pyrophoric action when it leaves the leach bath. The foil can then be spooled and preserved with caustic, or rinsed first in tank 97, as shown in FIG. 2. The rinsed tape can then be led for spooling into an argon box such as that shown in FIG. 1. As added precaution extra rinsing water or other protective liquid can be applied to the foils as by nozzles 102 to make sure they are protected.

Pyrophorically activated nickel and pyrophorically activated iron keep well in nitrogen, argon or other inert gases. The nickel also keeps well in aqueous caustic having at least about ½% caustic particularly the aqueous caustic leach solution. Activated iron loses practically all its activity after 20 hours in used caustic leach, unless the caustic contains at least about 5 grams of dissolved tin per liter. Best preservation is obtained with at least 8 grams of dissolved tin per liter. Stannous chloride solutions having a pH below about 9 do not appreciably preserve activated iron any better than plain water.

In water containing less than about ½% caustic soda or caustic potash, activated nickel gradually loses its activity over a period of several days, and liquid hydrocarbon films permit more gradual loss or activity in both nickel and iron.

Diffusion coating with aluminum is best accomplished with metallic aluminum contacting the surface being coated, and in an atmosphere that promotes the formation of aluminum subhalides. Vapors containing halides or halogen are very effective for this purpose. Moisture present in that atmosphere is eliminated by reaction with the halide, so that it is not essential to start such a coating operation with absolutely dry materials or equipment.

A halide-saturated atmosphere provides the highest diffusuon coating rate, and when the halide is a solid or liquid at room temperature it is helpful to have an excess of such halide energizer in the pack. There is generally a gradual loss of energizer from the diffusion coating atmosphere when the diffusion retort is not totally sealed, and a ¾ or 1% content of energizer in the pack is effective where the pack at least half fills the retort in a batch treatment. A 2% energizer content provides even faster coating formation. For continous treatment, as in the process illustrated in FIG. 2, fresh energizer should be added to make up for losses. Mixtures of different energizers, such as $AlCl_3$ and $AlBr_3$ can be used and make-up energizer need not have the same composition as the original energizer, and can change from time to time.

Figure 3:
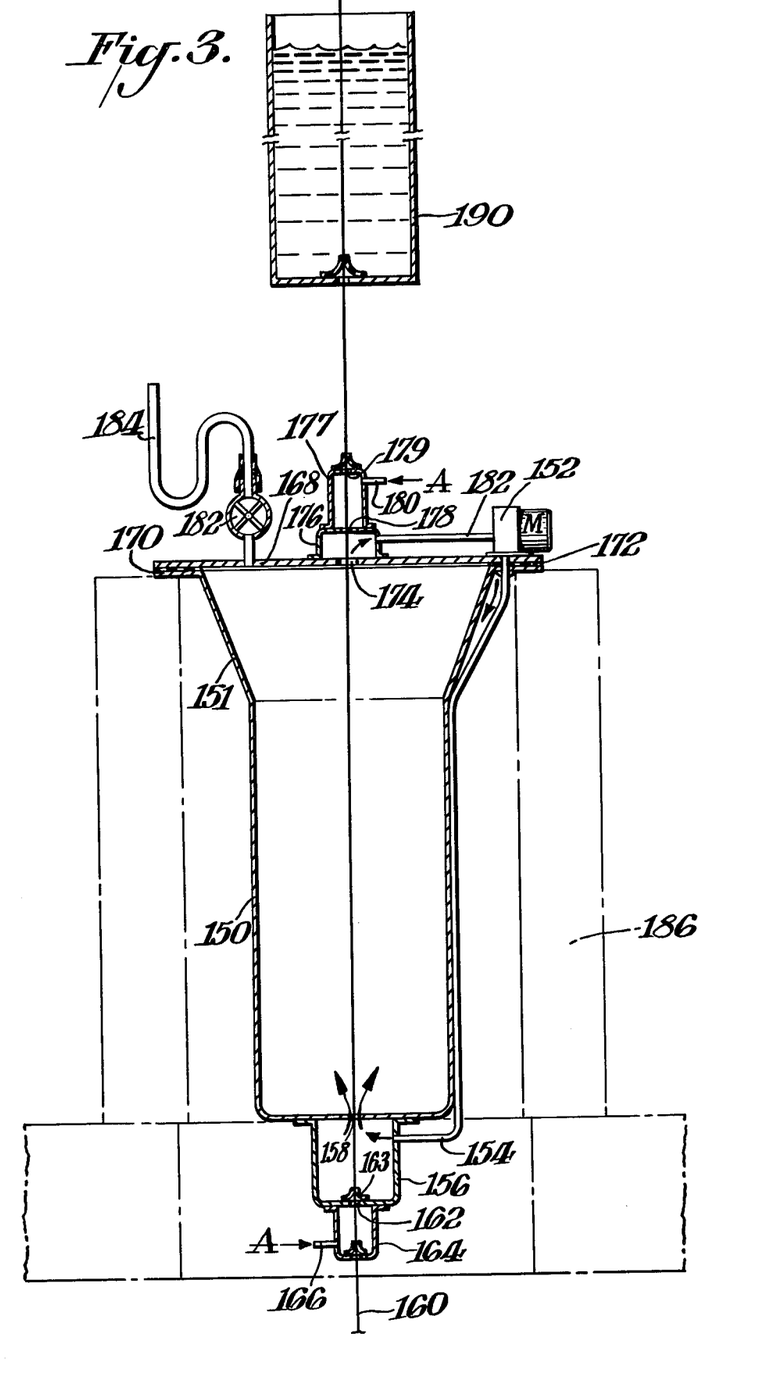

FIG. 3 shows another technique for continuous pyrophoric activation with aluminum diffusion followed by leaching. Here a retort 150 provides a container for a fluidized bed of diffusion coating powder than can merely be finely divided aluminum particles. Gas is blown by blower 152 through conduit 154 into a bell 156 at the bottom of the retort, from which bell the gas enters the retort through a slot 158 which also provides an entranceway for a foil 160 being treated. Opposite slot 158 the bell can have another slot 162 for receiving the foil, this slot closely fitting the foil and/or provided with sealing lips 163 of silicone rubber for example, to minimize escape of gas. As an added precaution bell 156 is fitted with a second slotted bell 164 around slot 162, and bell 164 is connected by line 166 to a source of argon or other protective gas to keep the gas pressure in it a little higher than the gas pressure in bell 156.

Retort 150 can be circular or square in horizontal sections, and its upper portion can be flared out as shown at 151 to reduce the internal gas velocity and thus reduce the solids concentration there. A cover 168 is tightly secured against a flanged lip 170 at the top of the retort, with the help of an intervening asbestos sealing gasket 172. A relatively wide exit slot 174 in the cover provides an exit passageway for both the tape and gas, the tape proceeding through a first exit bell 176 and a second exit bell 177. Bell 176 has a discharge slot 178 that may or may not be sealed, but bell 177 has a sealed exit slot 179. In addition a connector 180 connects the interior of bell 177 with a source of protective gas held at subatmospheric pressure.

Blower 152 has an intake conduit 182 opening into the interior of bell 176 and thus draws in the gas that it blows into lower bell 156. Such blowing action is arranged to expand the diffusion coating bed in retort 150 to about two to three times its settled height, preferably close to the level at which the retort begins to flare out. There is no real need to keep bed particles from escaping through exit slot 174, inasmuch as the particles are relatively soft aluminum and they will be propelled through the blower to the bottom of the retort without significant abrasion of the blower system.

A gas-lock type feeder 182 is provided for the cover and in the event the feeder is not absolutely gas-tight, it can also be used as a vent and connected to a manometer 184 which indicates the pressure in the reactor and also permits the discharge of gas when the pressure is excessive. The cover as well as the retort bottom can also be insulated if desired.

The retort 150 is placed inside a cylindrical oven 186 held on a suitable support base and arranged to heat up the retort as by sets of burners directed inwardly toward the retort. From the retort the tape 160 can be pulled through a leach tank 190 in a manner similar to that shown in FIG. 2.

The fluidized bed process of FIG. 3 takes a little longer than the unfluidized bed process of FIG. 2, and the foil should spend at least about 60 minutes in contact with the fluidized bed at a temperature of about 1050° F.

The diffusion coating temperatures used in the process of FIG. 3 or FIG. 2 can range from about 750° F. to about 1100° F., and the higher the temperature the shorter the diffusion time required. Below 750° F. the diffusion rate is too slow, and above 1100° F. aluminum particles tend to sinter together as well as sinter to the substrate being aluminized. The process of FIG. 3 is less likely to cause localized overheating of the aluminum, and can be carried out at a temperatures a little above 1100° F. It is preferred for the apparatus to provide a leach time at least long enough to fully activate the diffusion cases.

The retorts used in the diffusion coating treatments of FIGS. 2 and 3 can be made of steel such as low carbon steel, or if desired of the more expensive high carbon or stainless steels. The interior surfaces of these retorts become aluminized during use, but such aluminizing takes many days to penetrate into ⅛ inch thick retort walls sufficiently to seriously weaken them. Such penetration takes even longer in stainless steels.

The presence of stannite ions in the solution in which the leaching takes place, causes tin to deposit on the surfaces being leached. It appears that some of the aluminum diffused into those surfaces during the diffusion coating treatment reacts with the stannite ion to deposit metallic tin, and part of the deposited tin adheres to the surface being leached. A one mil thick iron foil after leaching in a bath of aqueous 1.2% stannite and 10% caustic soda, becomes coated with about 7% tin based on the leached weight. Such a tin-coated foil also shows a much smaller residual aluminum content than a corresponding foil leached in a bath that contains no stannite, has a more uniform pyrophoric activity, and when activated on only one face shows much less curl during a pyrophoric reaction, than a tin-free foil.

Nickel and iron screening can be activated by the techniques shown in FIGS. 2 and 3, but screening is generally at least about 3 or 4 mils thick. Any metal capable of receiving a diffusion coating of aluminum can be aluminized by these techniques, and separate workpieces can also be diffusion aluminized with a fluidized bed.

The foils fed into the retort of FIG. 2 can be held back-to-back with or without adhesive. When adhesive is used it will generally be pyrolyzed at the retort temperatures and may leave a residue on the foil backs. Such a residue generally does not prevent peeling the foils apart after they emerge from the retort, and can be removed as by inserting an ultrasonic cleaning generator in the liquid in tank 97 and operating the generator at 35,000 cycles per second for example. Preferred liquids for such cleaning in the tank, are water and methyl alcohol, with or without a small amount of detergent.

When screening is activated by the techniques of FIG. 2 or 3, two strips of screening can also be fed back-to-back through the retorts. No adhesive is needed to hold these strips together, and all surfaces of both strips will be diffusion coated in a single pass through a retort.

Stannate ion is also effective in protecting pyrophorically activated iron when added to the leaching bath. The stannate ion becomes reduced to stannite by reaction with the aluminum present in the aluminized surface.

An alcohol such as methanol and ethanol can be used to cover and block the pyrophoric action of activated nickel and iron. Activated nickel keeps fairly well this way, but activated iron begins to lose its activity after about 20 hours. Activated iron covered with methanol that completely fills a tightly stoppered container keeps much longer before beginning to lose its activity. Also dissolved oxygen can be removed beforehand from a liquid to be used as a blocking layer. To this end the liquid can be boiled a little, as by subjecting it to subatmospheric pressure, to drive off gases.

Radar and heat-detector decoys of the present invention are readily made from foils that are continuously activated. Such activated foils about 1 inch wide and wet with propylene oxide, can be continuously chopped into ½ inch lengths that are stacked in groups of about 500 per stack. Three or four of these stacks can be stuffed into a casing of a flare cartridge as illustrated in U.S. Pat. No. 4,171,669. When such a cartridge is fired the pyrophoric foils are blown out in a scattered mass, their blocking coating promptly evaporates, and they then undergo pyrophoric reaction as they flutter down. When so discharged from airplanes at high altitudes, the temperature dwell time is significantly longer than at sea level.

These decoys can also be used by ships, in which event it is better to have many more thousands of individual foils per cartridge.

The decoys can also be launched from simpler packages such as described in Ser. No. 25,456, now U.S. Pat. No. 4,349,612.

A temperature rise of at least about 250° F. maintained for 15 or more seconds is readily attained in pure iron or low carbon steel foils that have their pyrophoric surfaces impregnated with inert particles.

For packing strips of activated metal in a container such as a flare cylinder, a protective packing atmosphere is preferably used. The strips can also be wet with a volatile protective liquid such as propylene oxide or ethyl ether and even n-butylamine. Formic acid makes a more difficultly ignited protective liquid. Halogenated compounds such as monofluoro butane, chlorofluoro-methanes, and carbon tetrachloride rapidly reduce the pyrophoricity of the pyrophoric surfaces with which they come in contact.

When zinc is used as the selectively leachable metal, it is more readily diffused into iron and nickel to form a diffusion case, and is less readily removed from a diffusion case by a caustic leach. The pyrophorically activated surfaces thus produced behave quite similarly to those produced using aluminum as the selectively removable metal. Metallic zinc melts at about 419° C. and can be satisfactorily pack diffused into nickel and iron at temperatures of 700° F. to 900° F. or higher, when the zinc is mixed with at least about half its weight of inert refractory diluent like kaolin or alumina. Lower temperatures can also be used with less or no diluent. Anhydrous zinc chloride makes a very effective energizer for such diffusion coating. Pack diffusion of zinc into nickel at 800° to 850° F. in a pack containing equal weights of powdered zinc and powdered alumina, can be followed by leaching with 20% NaOH in water at 150° F. to make a pyrophoric surface. Similar zinc diffusion in iron is best leached out at lower temperatures and for only short times or with weaker alkali.

The iron and nickel activated in accordance with the present invention can contain small amounts of impurities or alloyed ingredients, generally up to about 1 or 2 percent, without significantly detracting from the pyrophoricity after activation. As pointed out above some impurities like carbon, aluminum, titanium and the like actually increase the pyrophoricity. Some ingredients, such as chromium, strongly depress the pyrophoric action, and as little as about 10% chromium in iron or iron-base alloys essentially completely inhibits the pyrophoricity. Thus, a screen of stainless steel wire containing 17% chromium as well as about half that much nickel, shows no detectable pyrophoricity when activated even though the presence of the nickel without the chromium would heighten the pyrophoricity.

Like pure iron or plain carbon steels, activated stainless steels should not be subjected to very aggressive exposure to caustic. Even a three hour treatment in hot 10% NaOH in water, as disclosed in U.S. Pat. No. 4,040,981, seriously damages the activated surface. Thirty minutes is about the maximum time of contact with caustic solutions as strong as or stronger than 10% aqueous NaOH. Weaker solutions do not seem to do a good job of leaching chromium-containing alloys. Thus 5% NaOH at 90° F. as described in U.S. Pat. No. 3,764,371, or even at 120° F., only leaches through about 0.01 mil of an aluminized case formed on type 410 stainless steel.

Suitable activation of chromium-containing iron alloys, as with pure iron or steel, calls for leaching of an aluminized case in caustic corresponding to between about 10 and about 20% aqueous NaOH, for a time of about 30 minutes. This keeps the activated stratum of metal from being damaged or removed. The aluminized case is best provided by standard powder peak diffusion, although the techniques of FIGS. 2 and 3 can also be used to prepare activated screens, foils or sheets. The case should be at least 0.2 mil thick. A 1 mil thick case is more than adequate, and greater thicknesses can also be used. An activated stratum at least about 0.3 mil thick shows the fissured and fragmented structure described and illustrated in U.S. Pat. No. 4,154,705.

When the activated microporous nickel surface of the present invention is permitted to dry in Argon or other inert atmosphere, it becomes extremely reactive to aliphatically chlorinated hydrocarbons. Thus a nickel wire screen having an activated case as thin as 1.2 mils or as thick as 6 mils, when wet with water or acetone and dried in an Argon box, will undergo an explosive reaction with methyl chloroform or methylene chloride vapors that are introduced into the box. Also the surface so activated and dried reacts vigorously with liquid chlorinated hydrocarbon such as methylene chloride, causing evolution of gas and heat.

The testing technique described in connection with FIG. 1, can accordingly be modified to test for the presence of chlorinated hydrocarbon vapor. Also the dried activated microporous layer can be used to remove small amounts of chlorinated hydrocarbon from solution in a solvent like a hydrocarbon that is inert to the layer. A stream of such solvent containing chlorinated hydrocarbon impurity can for example be passed through a stack of such suitably prepared screens to cause the impurity to give up its chlorine to the microporous activated screen surfaces. The chlorine so removed from the chlorinated hydrocarbon is replaced by hydrogen, and the microporous nickel can accordingly be used as a dehalogenating agent.

Aliphatically brominated, iodinated and fluorinated hydrocarbons react similarly, but the reaction of aliphatically fluorinated hydrocarbons is much less vigorous. Also halogenated hydrocarbons containing six or more carbon atoms in the molecule show a more modest reaction severity with the prepared activated microporous nickel. Aromatically halogenated hydrocarbons are essentially non-reactive with such nickel. The presence of other active groups on an aliphatically halogenated hydrocarbon does not block the reaction with the activated microporous nickel, although they lower the volatility of the compound.

The drying of the activated surface before subjecting it to such reactions, seems critical. Dropping a highly activated nickel screen, wet with acetone, into liquid methylene chloride causes the screen to undergo a very slow loss of activity, with essentially no other indication of a reaction. The reactivity of the dried activated microporous nickel with halogenated compounds is much greater when the compounds are in vapor form as compared to liquid form. Accordingly dehalogenation is much more rapidly effected on a gaseous feed stock.

Obviously many modifications and variations of the present invention are possible in the light of the above teachings. It is, therefore, to be understood that within the scope of the appended claims the invention may be practiced otherwise than as specifically described.

I claim:

1. A pyrophoric foil that develops a temperature of at least about 500° F. upon exposure to air, and made by pyrophorically activating a foil of low carbon steel not over about 1.5 mils thick, the activating leaving an unactivated stratum about 0.3 mil thick.

2. The foil of claim 1 in which only one of its faces has been pyrophorically activated.

3. A pyrophoric article comprising a pyrophoric metal foil to the surface of which a tape is adhered by means of a pressure-sensitive adhesive coating on the tape and the tape holds combustible particles against the foil.

4. The combination of claim 3 in which the combustible particles are metal or carbon.

5. A pyrophoric iron or steel foil which after activation has been subjected to a rolling treatment that develops a pressure of about 20,000 to about 200,000 pounds per square inch, and after rolling has been impregnated with finely divided inert particles.

6. The pyrophoric foil of claim 5 in which before activation the foil was 1010 steel.

7. In the method of preparing pyrophoric iron by leaching aluminized iron with aqueous caustic to dissolve out much of the aluminum and thus render the leached surface pyrophoric, the improvement according to which the aqueous caustic used for the leaching also contains stannite ions that help preserve the pyrophoricity.

* * * * *

UNITED STATES PATENT AND TRADEMARK OFFICE
CERTIFICATE OF CORRECTION

PATENT NO. : 4,435,481
DATED : March 6, 1984
INVENTOR(S) : Alfonso L. Baldi

It is certified that error appears in the above-identified patent and that said Letters Patent are hereby corrected as shown below:

Column 8, line 1, after "ethanolamine" insert a comma;

line 3, after "abandoned" insert a comma;

line 43, correct the spelling of "seconds";

Column 13, line 4, change "or" to --of--;

line 16, correct the spelling of "diffusion";

Column 16, line 41, change "0.01" to --0.1--; and line 49, change "peak" to --pack--.

Signed and Sealed this

Sixteenth Day of October 1984

[SEAL]

Attest:

GERALD J. MOSSINGHOFF

*Attesting Officer*  *Commissioner of Patents and Trademarks*